United States Patent [19]
Gillig et al.

[11] Patent Number: 5,703,539
[45] Date of Patent: *Dec. 30, 1997

[54] APPARATUS AND METHOD FOR CONTROLLING THE LOOP BANDWIDTH OF A PHASE LOCKED LOOP

[75] Inventors: Steven Frederick Gillig, Roselle; Jeannie Han Kosiec, Schaumburg, both of Ill.

[73] Assignee: Motorola, Inc., Schaumburg, Ill.

[*] Notice: The terminal 24 months of this patent has been disclaimed.

[21] Appl. No.: 145,841

[22] Filed: Dec. 17, 1993

[51] Int. Cl.$^6$ .............................. H03L 7/093; H03L 7/18
[52] U.S. Cl. ........................ 331/16; 331/17; 331/25; 331/DIG. 2
[58] Field of Search ........................... 331/16, 17, 25, 331/DIG. 2

[56] References Cited

U.S. PATENT DOCUMENTS

| | | | |
|---|---|---|---|
| 4,156,855 | 5/1979 | Crowley | 331/1 A |
| 4,745,372 | 5/1988 | Miwa | 331/8 |
| 4,901,033 | 2/1990 | Herold et al. | 331/1 A |
| 4,926,141 | 5/1990 | Herold et al | 331/16 |
| 5,008,635 | 4/1991 | Hanke et al. | 331/1 A |
| 5,126,690 | 6/1992 | Bui et al. | 331/1 A |
| 5,128,632 | 7/1992 | Erhart et al. | 331/1 A |
| 5,151,665 | 9/1992 | Wentzler | 331/8 |
| 5,208,546 | 5/1993 | Nagaraj et al. | 328/155 |

*Primary Examiner*—Siegried H. Grimm
*Attorney, Agent, or Firm*—Kevin D. Kaschke

[57] ABSTRACT

In a phase locked loop (PLL) (308), an edge proximity detector (302) identifies a phase error, indicative of a difference between a phase of a reference frequency signal (115) and a phase of an output frequency signal (116 or 117), as either desirable or undesirable. When the phase error is identified as desirable, a counter (301) determines a rate of change of the phase error over a first predetermined time period (412) to provide an indication of frequency error (306) between the frequency of the reference frequency signal (206) and the frequency of the output frequency signal (116 or 117); and a loop bandwidth adjuster (310) controls a transition between a first and a second loop bandwidth state of the PLL (308) responsive to the indication of the frequency error (306). When the phase error is identified as undesirable, the PLL (308) operates in the second loop bandwidth state. The present invention advantageously provides an accurate determination of when to vary the loop bandwidth of the PLL (308).

18 Claims, 6 Drawing Sheets

APPARATUS AND METHOD FOR CONTROLLING THE LOOP BANDWIDTH OF A PHASE LOCKED LOOP

FIELD OF THE INVENTION

The present invention relates generally to radio communication transceivers and, more particularly, to an apparatus and method for controlling the loop bandwidth of a phase locked loop.

BACKGROUND OF THE INVENTION

Figure 1:
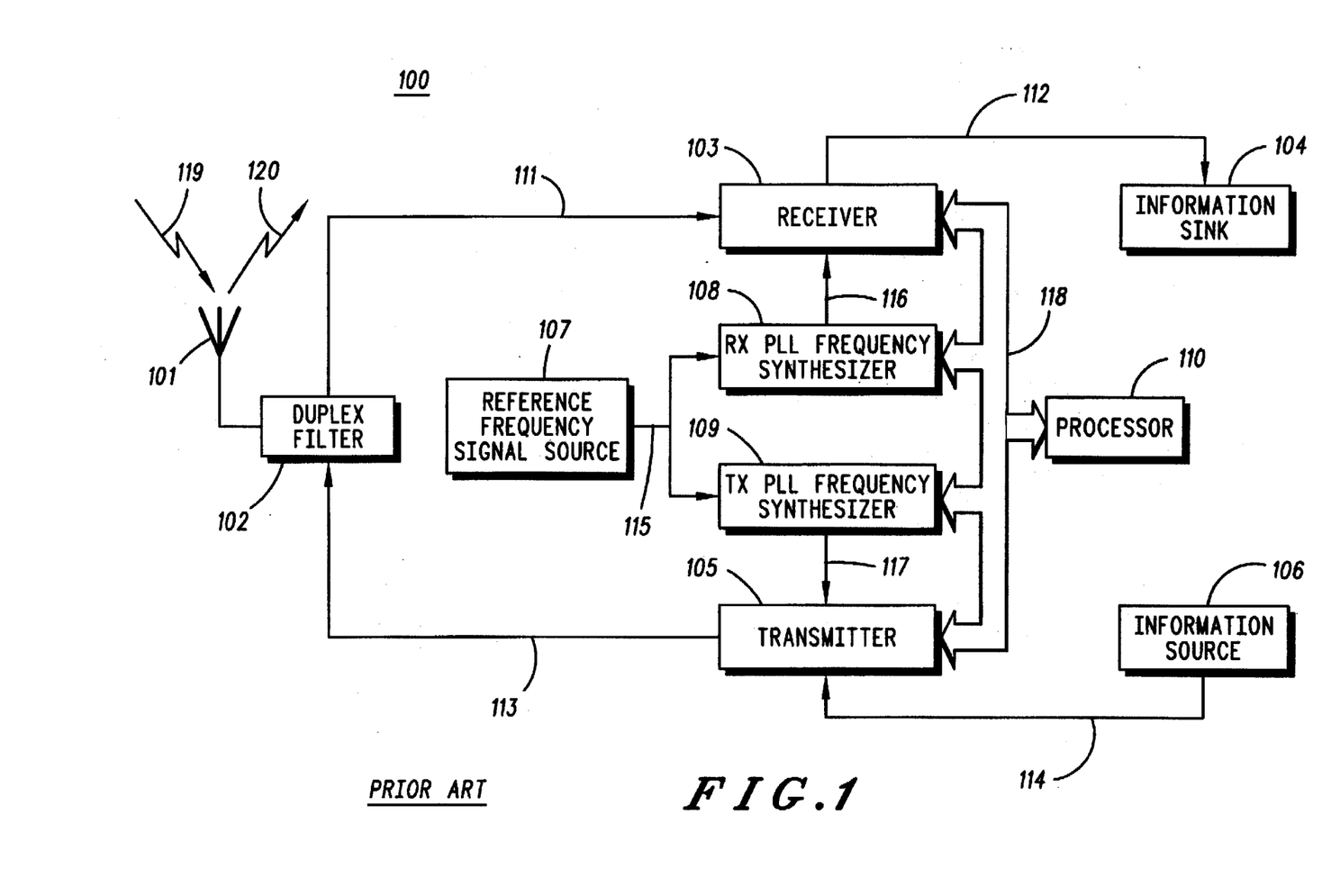
FIG. 1 illustrates a block diagram of a conventional radio communication transceiver.

FIG. 1 illustrates, by example, a block diagram of a conventional radio communication transceiver 100 (hereinafter referred to as "transceiver"). The transceiver 100 enables a mobile or portable subscriber unit to communicate with a base station (not shown), for example, over radio frequency (RF) channels in a radio communication system (not shown). The base station thereafter provides communications with a landline telephone system (not shown) and other subscriber units. An example of a subscriber unit having the transceiver 100 is a cellular radiotelephone.

The transceiver 100 of FIG. 1 generally includes an antenna 101, a duplex filter 102, a receiver 103, a transmitter 105, a reference frequency signal source 107, a receive (Rx) phase locked loop (PLL) frequency synthesizer 108, a transmit (Tx) PLL frequency synthesizer 109, a processor 110, an information source 106, and an information sink 104.

The interconnection of the blocks of the transceiver 100 and operation thereof is described as follows. The antenna 101 receives a RF signal 119 from the base station for filtering by the duplex filter 102 to produce an RF received signal at line 111. The duplex filter 102 provides frequency selectivity to separate the RF received signal at line 111 and the RF transmit signal at line 113. The receiver 103 is coupled to receive the RF received signal at line 111 and operative to produce a received baseband signal at line 112 for the information sink 104. The RF signal source 107 provides a reference frequency signal at line 115. The Rx PLL frequency synthesizer 108 is coupled to receive the RF signal at line 115 and information on a data bus 118 and operative to produce a receiver tune signal at line 116 to tune the receiver 103 to a particular RF channel. Likewise, the Tx PLL frequency synthesizer 109 is coupled to receive the RF signal at line 115 and information on the data bus 118 and operative to produce a transceiver tune signal at line 117 to tune the transmitter 105 to a particular RF channel. The processor 110 controls the operation of the Rx PLL frequency synthesizer 108, the Tx PLL frequency synthesizer 109, the receiver 103, and the transmitter 105 via the data bus 118. The information source 106 produces a baseband transmit signal at line 114. The transmitter 105 is coupled to receive the baseband transmit signal at line 114 and operative to produce the RF transmit signal at line 113. The duplex filter 102 filters the RF transmit signal at line 113 for radiation by the antenna 101 as a RF signal 120.

The RF channels in a cellular radiotelephone system, for example, include voice and signaling channels for transmitting and receiving (hereinafter referred to as "transceiving") information between the base station and the subscriber units. The voice channels are allocated for transceiving voice information. The signaling channels, also referred to as control channels, are allocated for transceiving data and signaling information. It is through these signaling channels that the subscriber units gain access to the cellular radiotelephone system and are assigned a voice channel for further communication with the landline telephone system. In cellular radiotelephone systems capable of transceiving wideband data on the signaling channels, the frequency spacing of the signaling channels may be a multiple of the frequency spacing of the voice channels.

In some cellular radiotelephone systems, the transceiver 100 and the base station intermittently transceive information therebetween on the signaling channel. One such system, for example, uses a time division multiple access (TDMA) signaling method to synchronize the intermittent information. In this type of system, keeping the transceiver 100 fully powered during the entire time that the transceiver 100 is tuned to the signaling channel unnecessarily drains the transceiver's battery during those times when the information is not received. Therefore, portions of the transceiver 100 can be powered off to prolong battery life when the transceiver is not transceiving information. Further, portions of the transceiver 100 can be powered off to prolong battery life when the signal quality is good enough such that further repetition of the same information is not needed. Intermittently powering on and off, i.e. enabling and disabling, the transceiver 100 during its receive operation is called discontinuous receive (DRX) mode of operation. In the DRX mode of operation, quickly enabling and disabling the portions of the transceiver 100 produces the greatest savings in battery life.

Figure 2:
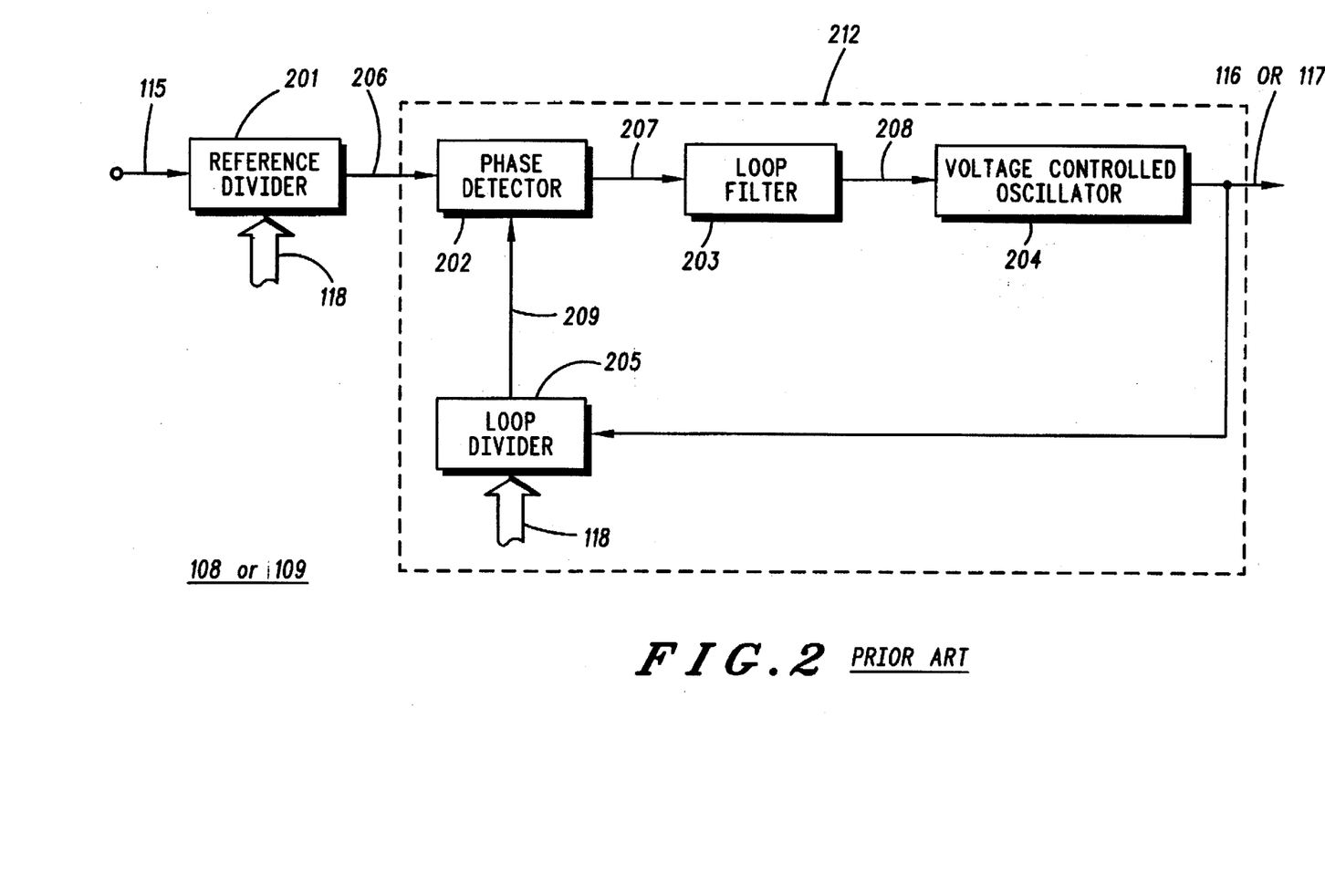
FIG. 2 illustrates a block diagram of a conventional phase locked loop frequency synthesizer for use in the radio communication transceiver of FIG. 1.

FIG. 2 illustrates, by example, a block diagram of a conventional phase locked loop (PLL) frequency synthesizer for use in the transceiver 100 of FIG. 1. The general structure of the PLL frequency Synthesizer of FIG. 2 is the same for both the Rx PLL frequency synthesizer 108 and the Tx PLL frequency synthesizer 109.

The PLL frequency synthesizer 108 or 109 of FIG. 2 generally includes a reference divider 201, for discussion purposes, and a PLL 212. The PLL 212 generally includes a phase detector 202, a loop filter 203, a voltage controlled oscillator 204, and a loop divider 205. The reference divider 201 receives a reference frequency signal on line The interconnection of the blocks of the PLL frequency synthesizer 108 or 109 is described as follows. The phase detector 202 is coupled to receive a divided reference frequency signal at line 206 and a feedback signal at line 209, and operative to produce a phase error signal at line 207. The loop filter 203 is coupled to receive the phase error signal 207, and operative to produce a filtered signal at line 208. The voltage controlled oscillator 204 is coupled to receive the filtered signal at line 208 and operative to produce an output frequency signal at line 116 or 117. The loop divider 205 is coupled to receive the output frequency signal at line 116 or 117, and operative to produce the feedback signal at line 209. The loop divider 205 and the reference divider 201 receives programming information via the data bus 118.

The operation of the PLL frequency synthesizer 108 or 109 is described as follows. The PLL 212 is a circuit which produces the output frequency signal at line 116 or 117 synchronized to the reference frequency signal at line 115. The output frequency signal at line 116 or 117 is synchronized or "locked" to the reference frequency signal at line 115 when the frequency of the output frequency signal at line 116 or 117 has a predetermined frequency relationship to the frequency of the reference frequency signal at line 115. Under locked conditions, the 212 PLL typically provide a constant phase difference between the reference frequency signal at line 115 and the output frequency signal at line 116 or 117. The constant phase difference may assume any desired value including zero. Should a deviation in the desired phase difference of such signals develop, i.e., should a phase error at line 207 develop due to, e.g., variation in either the frequency of the reference frequency signal at line 115 or programmable parameters of the PLL via the data bus 118, the PLL will attempt to adjust the frequency of the output frequency signal at line 116 or 117 to drive the phase error at line 207 toward zero.

The PLL frequency synthesizer 108 or 109 may be classified as belonging to one of at least two categories based on the predetermined frequency relationship of the output signal frequency at line 116 or 117 to the frequency of the reference frequency signal at line 115. The first category is classified as an "integer division" PLL frequency synthesizer wherein the relationship between the output frequency signal at line 116 or 117 and reference frequency signal at line 115 is an integer. The second category is classified as a "fractional division" PLL frequency synthesizer in which the relationship between the output frequency signal at line 116 or 117 and reference frequency signal at line 115 is a rational, non-integer number, consisting of an integer and a fraction.

PLL's are characterized by a loop bandwidth. For some applications it is desirable to vary the loop bandwidth of the PLL under certain conditions such as, for example, when the frequency of the reference frequency signal at line 115 changes or when the programmable parameters of the PLL via the data bus 118 change. Appropriately varying the loop bandwidth advantageously provides shorter locktime, improved noise, and lower spurious signals.

A problem with varying the loop bandwidth of the PLL 212 includes determining when to vary the loop bandwidth. Determining when to vary the loop bandwidth directly affects the time required for the PLL 212 to reach a desirable locked condition. It is generally desirable for the PLL 212 to reach its locked condition quickly. If the locked condition of the PLL 212 is not reached quickly, noise may be generated or information may be lost.

One prior art solution for determining when to vary the loop bandwidth of the PLL 212 is to vary the loop bandwidth at a predetermined time. The disadvantage with this approach is that the predetermined time does not always correspond to the optimal time required for the PLL 212 to reach its desired lock condition because the predetermined time is not related to the state of the PLL 212.

Another prior art solution for determining when to vary the loop bandwidth of the PLL 212 is to vary the loop bandwidth based on an instantaneous phase error at line 207. The disadvantage with this approach is that the instantaneous phase error at line 207 does not fully describe the state of the PLL 212 for all times.

Accordingly, there is a need for an improved apparatus and method for controlling the loop bandwidth of a PLL advantageously providing an accurate determination of when to vary the loop bandwidth of the PLL.

DETAILED DESCRIPTION OF A PREFERRED EMBODIMENT

In accordance with the present invention, the foregoing need is substantially met by improved apparatus and method for controlling the loop bandwidth of a PLL. According to the present invention, the apparatus and method identifies a phase error, indicative of a difference between the phase of the reference frequency signal and the phase of an output frequency signal, of the PLL as either desirable or undesirable. When the apparatus and method identifies the phase error as desirable, the apparatus and method determines a rate of change of the phase error over a first predetermined time period to provide an indication of frequency error between the frequency of the reference frequency signal and the frequency of the output frequency signal; and controls a transition between a first and a second loop bandwidth state of the PLL responsive to the indication of the frequency error. When the apparatus and method identifies the phase error as undesirable, the PLL operates in the second loop bandwidth state. The present invention advantageously provides an accurate determination of when to vary the loop bandwidth of the PLL.

Figure 3:
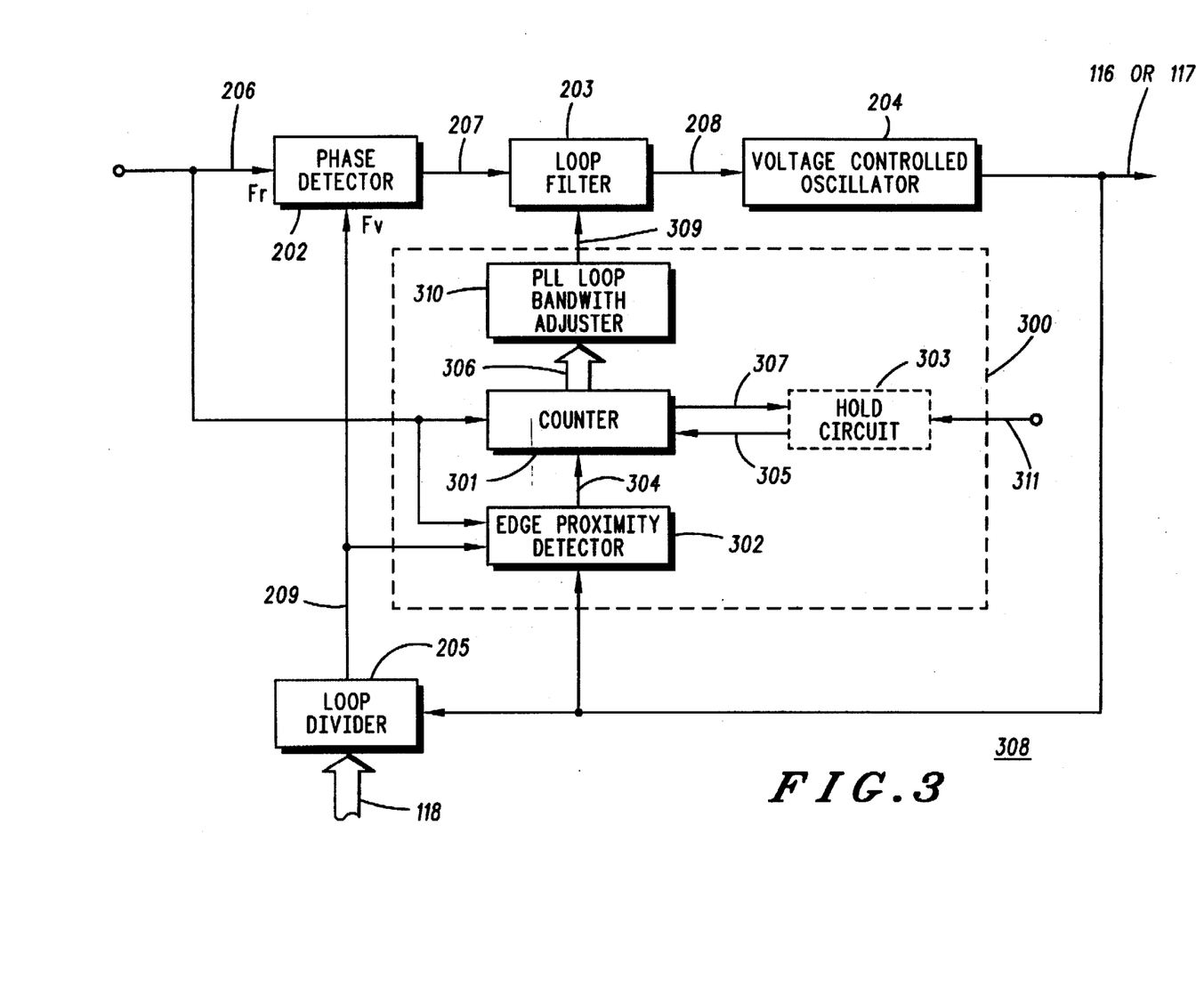
FIG. 3 illustrates a block diagram of a phase locked loop in accordance with the present invention.

The present invention can be more fully described with reference to FIGS. 3–6, wherein FIG. 3 illustrates a block diagram of a phase locked loop 308 in accordance with the present invention. The PLL 308 has the same structure and operates in the same manner as the prior art PLL 212 with the exception of a novel apparatus 300 and the associated method therefor. Therefore, in the preferred embodiment of the present invention, the novel PLL 308 is substituted for the prior art PLL 212 for use in the Rx PLL frequency synthesizer 108 or in the Tx PLL frequency synthesizer 109 in the transceiver 100. One of ordinary skill in the art of PLL design and application may find other applications for the novel PLL 308 both inside and outside the radio communications field.

The novel PLL circuit 308 generally includes a phase detector 202, a loop filter 203, a voltage controlled oscillator (VCO) 204, a loop divider 205, and a loop bandwidth controller 300. Individually, the phase detector 202, the loop filter 203, the VCO 204, and the loop divider 205 are generally well known in the art; thus, no further discussion will be presented except to facilitate the understanding of the present invention. A novel loop bandwidth controller 300 will be described and illustrated below with reference to FIGS. 3–6, in accordance with the present invention.

The novel PLL 308, with the exception of the novel loop bandwidth controller 300, may be implemented, for example, using a Motorola MC145170 PLL frequency synthesizer and a Motorola MC1648 voltage controlled oscillator. The loop filter 205 may be implemented, for example, with standard resistors and capacitors in accordance with well known filter design techniques.

Generally, the novel PLL 308 operates as follows. The novel PLL 308 generates an output frequency signal responsive to a reference frequency signal. The output frequency signal and the reference frequency signal are each characterized by frequency and phase. A phase error is indicative of the difference between the phase of the reference frequency signal and the phase of the output frequency signal. The PLL is operative in a first loop bandwidth state to maintain the output frequency signal substantially at a frequency indicative of the reference frequency signal, and operative in a second loop bandwidth state to converge the output frequency signal to the frequency indicative of the reference frequency signal.

The interconnections between the novel loop bandwidth controller 300 and the conventional PLL loop 212 to form the novel PLL 308 are as follows. The loop bandwidth controller 300 is coupled to receive the divided reference frequency signal at line 206, the feedback signal at line 209, and the output frequency signal at line 116 or 117. The novel loop bandwidth controller 300 produces a loop bandwidth adjust signal at line 309 that is coupled to the loop filter 203.

The loop bandwidth controller 300 further comprises an edge-proximity detector 302, a counter 301, a PLL loop bandwidth adjuster 310, and an optional hold circuit 303. Individually, the edge-proximity detector 302, the counter 301, the PLL loop bandwidth adjuster 310 and the optional hold circuit 303 are well known in the art; hence, no additional description need be provided here except as may be necessary to facilitate the understanding of the present invention. The combination of the edge-proximity detector 302, the counter 301, the PLL loop bandwidth adjuster 310, and the optional latch circuit 303 as used in the novel PLL 308 of FIG. 3 is considered to be novel and will be described in further detail below.

The edge-proximity detector 302 and the hold circuit 303 may be implemented, for example, using standard logic elements. Such logic elements may include, for example, NAND gates as a Motorola MC74HC00, NOR gates such as MC74HC02, and D-type flip-flops such as MC74HC74 in accordance with well known logic design techniques. The counter 301, may be implemented, for example, using a conventional counter such as a Motorola MC74HC173. The PLL loop bandwidth adjuster 310 may be implemented with standard resistors and capacitors and using standard analog multiplexers such as Motorola's MC74HC4066 in accordance with well known design techniques.

The interconnections between the blocks of the novel loop bandwidth controller 300 are as follows. The edge-proximity detector 302 is coupled to receive the divided reference frequency signal at line 206 and the feedback signal at line 209, and operative to produce a counter reset signal at line 304. The counter 301 is coupled to receive the divided reference frequency signal at line 206 and the counter reset signal at line 304, and operative to produce a count value at line 306 and an indication of the count value at line 307. The optional hold circuit 303 is coupled to receive indication of the count value at line 307 and a hold enable signal at line 311 produced by the processor 110, and operative to produce a hold signal at line 305 for the counter 301.

The operation of the novel loop bandwidth controller 300 is as follows. According to the present invention, the edge proximity detector and associated method therefor identifies a phase error, indicative of a difference between the phase of the divided reference frequency signal 206 and the phase of an output frequency signal 116 or 117, of the PLL 308 as either desirable or undesirable. When the edge-proximity detector 302 identifies the phase error as desirable, the counter 301 and associated method therefor determines a rate of change of the phase error over a first predetermined time period to provide an indication of frequency error between the frequency of the divided reference frequency signal 206 and the frequency of the output frequency signal 116 or 117; and the loop bandwidth adjuster 310 controls a transition between a first and a second loop bandwidth state of the PLL responsive to the indication of the frequency error. When the edge-proximity detector 302 identifies the phase error as undesirable, the loop bandwidth adjuster 310 operates the PLL in the second loop bandwidth state.

The purpose of novel loop bandwidth controller 300 is to indicate how close the loop is to being locked. As the loop gets close to lock, a different loop bandwidth state may be desirable to converge the output frequency signal at line 116 or 117 to the divided reference frequency signal at line 206.

The novel loop bandwidth controller 300 provides a better bandwidth control than the prior art. Because it provides a more accurate indication of frequency error to control the loop bandwidth.

Within the scope of the present invention, alternative interconnections between the novel loop bandwidth controller 300 and the conventional PLL 212 may be implemented to form the novel PLL 308. The edge-proximity detector 302 may alternatively be coupled to receive the phase error signal at line 207 from the phase detector 202 in place of the divided reference frequency signal 206 and the loop feedback signal 209. The counter 301 may alternatively be coupled to receive the feedback signal at line 209 in place of the reference frequency signal 206. The PLL loop bandwidth adjuster output 309 may alternatively be coupled to other elements of the PLL 308 to adjust the loop bandwidth in accordance with well known design techniques.

According to the preferred embodiment of the present invention, the phase error identifier is accomplished by an edge-proximity detector operative to detect the edge-proximity, relative to a second predetermined time period, of an indication of the phase of the reference frequency signal to an indication of the phase of the output frequency signal. An advantage provided by the edge-proximity detector is that an exact measurement of phase error is not required to control the loop bandwidth, but only an indication of the desirability of the phase error. Further, digital processing of the phase error signal at line 207 is difficult to achieve when the phase error at line 207 is small, i.e. when the PLL 308 is close to lock.

According to the preferred embodiment of the present invention, the second predetermined time period is a function of the inverse of the frequency of the output frequency signal 116 or 117. The inverse of the frequency of the output frequency signal 116 or 117 is used because the frequency of the output frequency signal is the highest frequency available in the PLL 308 that results in the best resolution for determining the frequency error.

According to the preferred embodiment of the present invention, the rate of change determiner 301 is accomplished by a counter 301 operative to count consecutive occurrences of the phase error identified as desirable. The counter 301 is used because it conveniently provides a digital means of determining the rate of change of the phase error. Further, varying the length of the counter 301 advantageously varies the resolution of the loop bandwidth controller 300.

According to the preferred embodiment of the present invention, the first predetermined time period is a function of the inverse of the frequency of either the divided reference frequency signal 206 or the output frequency signal 116 or 117. The first predetermined time period is a function of the inverse of the frequency of either the divided reference frequency signal 206 or the output frequency signal 116 or 117 because the first predetermined time period should be longer than the second predetermined time period. The larger the ratio between the first and second predetermined time periods, the better the resolution of the loop bandwidth controller 300.

According to the preferred embodiment of the present invention, the loop bandwidth adjuster 310 controls the transition by alternatively selecting between the first and the second loop bandwidth states of the PLL 308 responsive to the indication of the frequency error 306.

Alternatively, the loop bandwidth adjuster controls the transition by varying a loop bandwidth value of the second loop bandwidth state of the PLL responsive to the indication of the frequency error.

According to the preferred embodiment of the present invention, the optional hold circuit 303 advantageously prevents oscillation between the first and second loop bandwidth states for applications where undesirable transient signals may be produced when the loop bandwidths are switched.

The PLL 308 of FIG. 3 may also include a charge pump and a prescaler (both not shown), as is well known in the art. The prescaler would be used between the VCO 204 and the loop divider 205 in the feedback path at line 116 or 117 to permit higher the loop divider 205 to accept higher input frequencies from the VCO 204. The charge pump would be used at the output of the phase detector 202 to provide high DC loop gain for the PLL 308.

Figure 4:
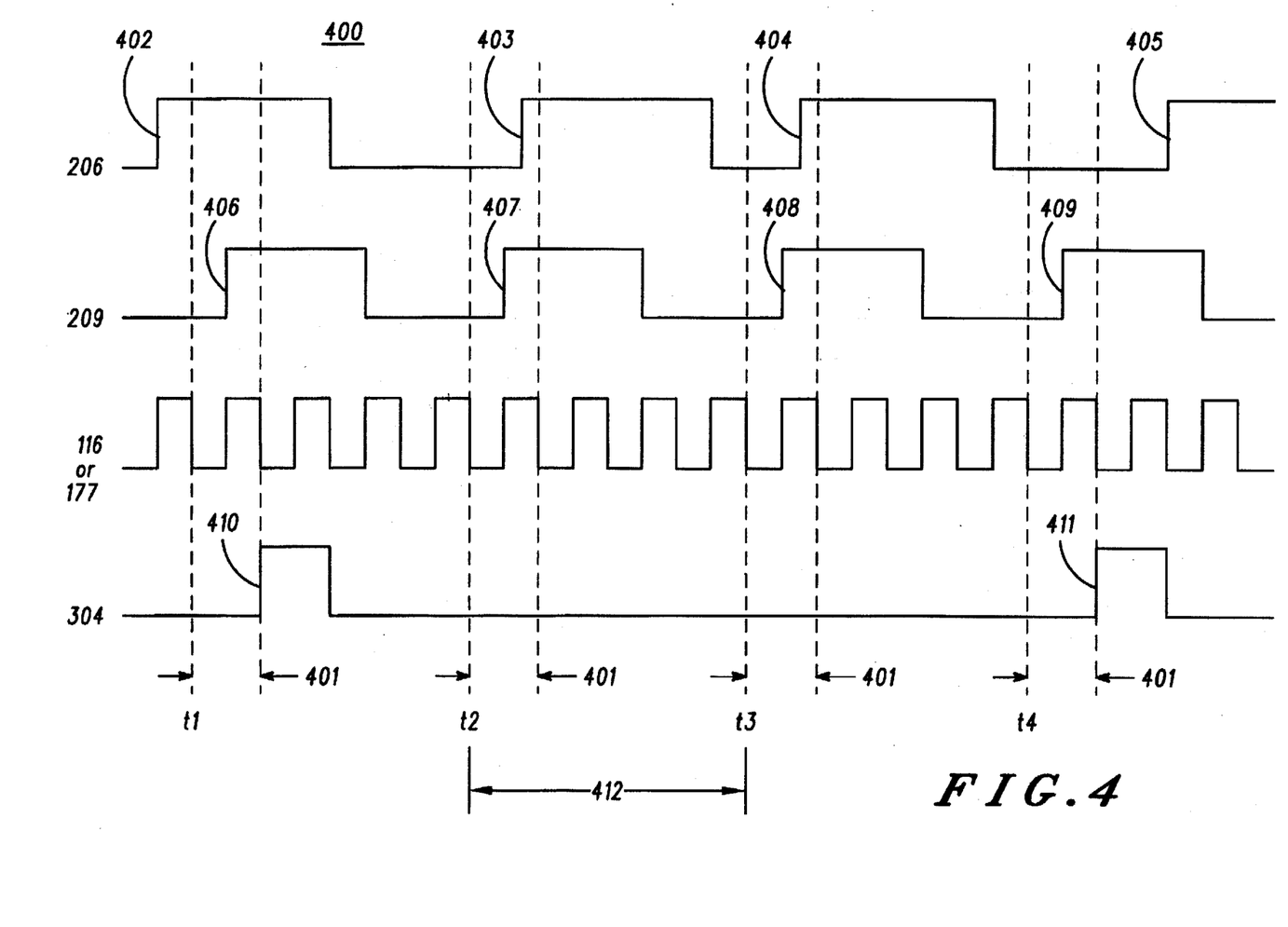
FIG. 4 is a timing diagram illustrating digital signals in a loop bandwidth controller of the phase locked loop of FIG. 3 in accordance with the present invention.

FIG. 4 is a timing diagram illustrating digital signals in the loop bandwidth controller 300 of the phase locked loop 308 of FIG. 3 in accordance with the present invention. The timing diagram shows the divided reference signal 206, the feedback signal 209, the output frequency signal 116 or 117, and the counter reset signal 304.

The reference signal 206 has rising edges 402, 403, 404, and 405. The feedback signal 209 has rising edges 406, 407, 408, and 409. The counter reset signal 304 defines a reset signal to the counter 301 in FIG. 3. When the counter reset signal 304 is high, the counter 301 is reset. The period of the VCO output frequency signal 116 or 117 defines the second predetermined time period 401 during which the rising edges of the divided reference signal 206 and the feedback signal 209 are checked for edge-proximity.

When the rising edges of the divided reference signal 206 and the feedback signal 209 are determined to be within the second predetermined time period 401, the phase error is considered to be desirable. When one of the rising edges of the divided reference signal 206 and the feedback signal 209 is determined not to be within the second predetermined time period 401, the phase error is considered to be undesirable. In other words, the second predetermined time period 401 provides a threshold to which the desirability of the phase error is compared.

At time t1, the rising edges 402 and 406 are not determined to be in edge-proximity, since the rising edges 402 and 406 do not fall within the second predetermined time period 401. Under such conditions, the counter 301 is reset on the rising edge 410 of the counter reset signal 304.

At time t2, the rising edges 403 and 407 are determined to be in edge-proximity since the rising edges 403 and 407 do fall within the second predetermined time period 401. Under such conditions, the counter reset signal 304 remains low so that the counter 301 is not reset such that the counter 301 is clocked by the rising edge 403.

At time t3, the rising edges 404 and 408 are also determined to be in edge-proximity since the rising edges 404 and 408 do fall within the second predetermined time period 401. Here again the counter 301 is clocked by rising edge 404. The value of the counter 301 is now two as a result of being clocked by the two rising edges 403 and 404. Thus, the counter 301 counts successive occurrences where the rising edges of divided reference frequency signal 206 and feedback signal 209 are considered to be in edge-proximity. The counter 301 determines the rate of change of the phase error over a first predetermined time period 412 to provide an indication of frequency error at line 306 in FIG. 3 between the frequency of the divided reference frequency signal 206 and the frequency of the output frequency signal 116 or 117.

At time t4, the rising edges 405 and 409 are not determined to be in edge-proximity, since the rising edges 405 and 409 do not fall within the second predetermined time period 401. Under such conditions, the counter 301 is reset on the rising edge 411 of the counter reset signal 304.

Figure 5:
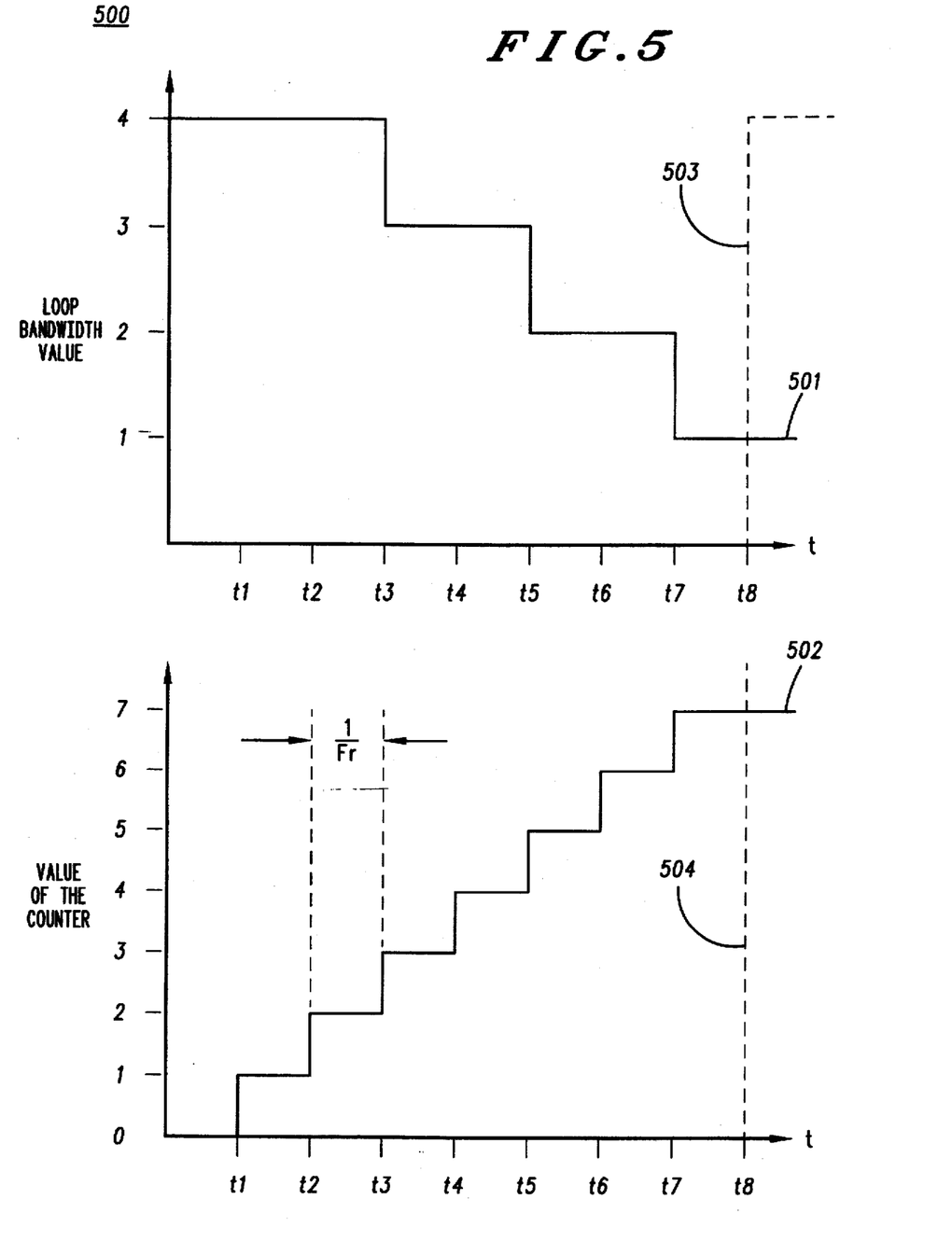
FIG. 5 illustrates graphs depicting a relationship between the value of a counter of the phase locked loop of FIG. 3 and the value of the loop bandwidth of the phase locked loop of FIG. 3 in accordance with the present invention.

FIG. 5 illustrates graphs depicting a relationship between the value of the counter of the loop bandwidth controller 300 of FIG. 3, as shown by curve 502, and the value of the loop bandwidth of the phase locked loop of FIG. 3, as shown by curve 501, in accordance with the present invention.

At time t0, the value of the counter 502, starts at 0 and the value of the loop bandwidth 501 starts at 4, representing a high loop bandwidth. Under the condition of edge-proximity of the divided reference frequency signal 206 and the feedback signal 209, during the second predetermined time period 401 beginning at t2 as illustrated in FIG. 4, the value of the counter 502 in FIG. 5 is incremented to a value of 1 at t1. Since the counter 301 is clocked by the divided reference signal 206 at a rate of 1/Fr, its count continues to increase by one at t2, t3, etc. through t7.

The value of the loop bandwidth 501 may have many desirable alternative relationships to the value of a counter 502 of the loop bandwidth controller 300, but herein is shown as having a monotonically decreasing value of loop bandwidth 501 as the value of the counter 502 increases. The loop bandwidth value 501 is shown decreasing to a value of 3 at time t3, further decreasing to a value of 2 at time t5, further decreasing to a value of 1 at t7, and remaining at a value of 1 after t7.

After time t8, an alternative curve for the value of the counter 502 is shown by curve 504 in which the value of the counter 504 drops to 0 at time t8 in response to the condition of non-edge-proximity, such as illustrated in FIG. 4 during the second predetermined time period 401 shown beginning at time t1. In FIG. 5, the alternative curve 503 for the value of the loop bandwidth 501 shows a response to the alternative counter value curve 504. In this response, the loop bandwidth value increases to 4 at time t8, since the divided reference frequency signal 206 and the feedback signal 209 are no longer in edge-proximity.

It should be apparent that the counter 301 could be either an up-counter as illustrated in FIG. 5 or alternatively a down-counter as long as the loop bandwidth adjuster 310 maps the count into the correct polarity of loop bandwidth adjustment such that the loop bandwidth generally decreases as the counter is clocked.

The following discussion provides a practical example explaining how to calculate the frequency error using the present invention under open loop conditions of the PLL. A steady-state frequency error at the output frequency signal 116 or 117 can be directly related to the maximum value of the counter 502 before the counter 301 is reset by an indication of non-edge-proximity 304.

The time period of the output frequency signal 116 or 117 is $1/(N \times Fv)$, where N is the value of loop divider 205. This is the total time window width 401 of the edge-proximity detector 302 for the condition when the Fr and Fv edges occur in time closer to each other than ½ the period of the output frequency signal 116 or 117. This is the time window width used for the edge-proximity detector 302 but other window widths are possible.

Dividing the window period, $1/(N \times Fv)$, by the period of the reference frequency signal 206, $1/Fr$, gives a ratio of the error frequency at the phase detector 202 to the frequency of the reference frequency signal 206 Multiplying this result by Fr gives $Fr^2/(N \times Fv)$, the frequency error at the input to phase detector 202 for slippage of Fv passed Fr by a time increment $1/(N \times Fv)$ in a time period $1/Fr$.

For the counter 301 to reach its end-of-count value, say C, the frequency error at the input to phase detector 202 must be less than $Fr^2/(C \times N \times Fv)$. Translating this frequency error from the input of phase detector 202 to the input of loop divider 205 gives $Fr^2/(C \times Fv)$, independent of N. For Fr approximately equal to Fv such as in an almost locked condition, the frequency error at the output frequency signal 116 or 117 would be approximately $Fr/C$. If an optional prescaler with a value of P were used between the output frequency signal 116 or 117 and the loop divider 205, the error at the output frequency signal 116 or 117 would be approximately $(Fr^2 \times P)/(C \times Fv)$.

For an example with Fr=1 MHz and C=250, in a steady-state condition the output frequency signal 116 or 117 would be in error by 1 MHz/250=4 KHz when the counter 301 reaches end-of-count.

Figure 6:
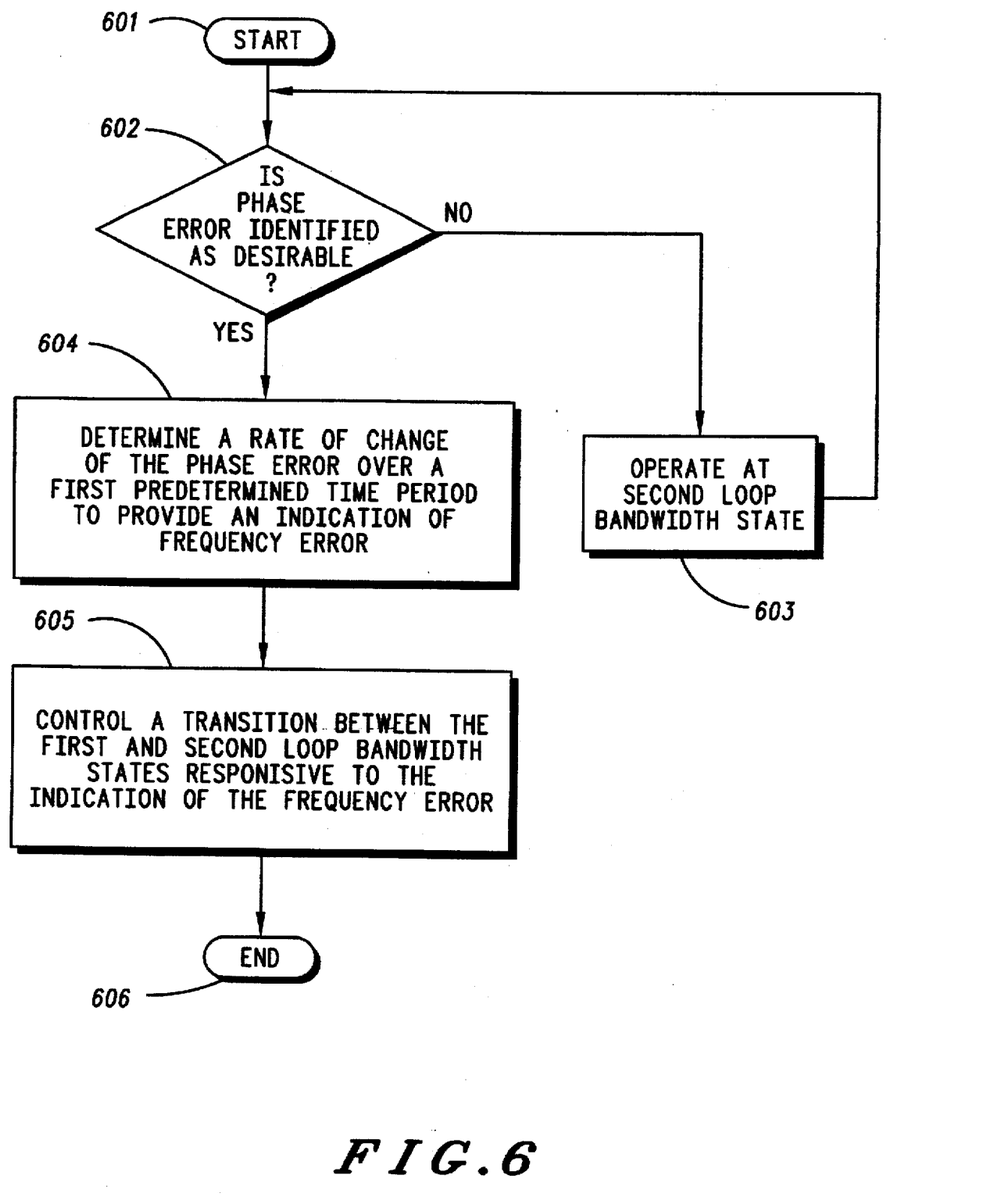
FIG. 6 illustrates a flow chart describing steps for controlling the loop bandwidth of the phase locked loop of FIG. 3 in accordance with the present invention.

FIG. 6 illustrates a flow chart describing steps for controlling the loop bandwidth of the phase locked loop 308 of FIG. 3 in accordance with the present invention. The flowchart starts at step 601. At step 602, the edge proximity detector 302 identifies a phase error, indicative of a difference between a phase of a reference frequency signal 115 and a phase of an output frequency signal 116 or 117, as either desirable or undesirable. When the phase error is identified as desirable at step 602, the counter 301 determines, at step 604, a rate of change of the phase error over a first predetermined time period 412 to provide an indication of frequency error 306 between the frequency of the divided reference frequency signal 206 and the frequency of the output frequency signal 116 or 117; and a loop bandwidth adjuster 310 controls, at step 605, a transition between a first and a second loop bandwidth state of the PLL 308 responsive to the indication of the frequency error 306. When the phase error is identified as undesirable at step 602, the PLL 308 operates, at step 603, in the second loop bandwidth state.

Thus, the present invention advantageously provides an apparatus and method 300 that accurately determines when to vary the loop bandwidth of the PLL 308. This advantage and others are generally provided by an apparatus and method that identifies a phase error, indicative of a difference between the phase of the reference frequency signal and the phase of an output frequency signal, of the PLL as either desirable or undesirable. When the apparatus and method identifies the phase error as desirable, the apparatus and method determines a rate of change of the phase error over a first predetermined time period to provide an indication of frequency error between the frequency of the reference frequency signal and the frequency of the output frequency signal; and controls a transition between a first and a second loop bandwidth state of the PLL responsive to the indication of the frequency error. When the apparatus and method identifies the phase error as undesirable, the PLL operates in the second loop bandwidth state. The present invention overcomes prior art problems, for example, generating noise or missing information, caused by inaccurately determining when to vary the loop bandwidth of the PLL.

While the present invention has been described with reference to illustrative embodiments thereof, it is not intended that the invention be limited to these specific embodiments. Those skilled in the art will recognize that variations and modifications can be made without departing from the spirit and scope of the invention as set forth in the appended claims.

What is claimed is:

1. In a phase lock loop (PLL) that generates an output frequency signal responsive to a reference frequency signal, the output frequency signal and the reference frequency signal are each characterized by frequency and phase, a phase error is indicative of the difference between the phase of the reference frequency signal and the phase of the output frequency signal, the PLL operative in a first loop bandwidth state to maintain the output frequency signal substantially at a frequency indicative of the reference frequency signal, and operative in a second loop bandwidth state to converge the output frequency signal to the frequency indicative of the reference frequency signal, a method for controlling the loop bandwidth of the PLL comprising the steps of:

identifying the phase error as either desirable or undesirable;

when the phase error is identified as desirable:

determining a rate of change of the phase error over a first predetermined time period to provide an indication of frequency error between the frequency of the reference frequency signal and the frequency of the output frequency signal; and controlling a transition between the first and second loop bandwidth states of the PLL responsive to the indication of the frequency error; and when the phase error is identified as undesirable, operating in the second loop bandwidth state.

2. A method according to claim 1 wherein the step of identifying the phase error as either desirable or undesirable further comprises the step of:

detecting the proximity, relative to a second predetermined time period, of an indication of the phase of the reference frequency signal to an indication of the phase of the output frequency signal.

3. A method according to claim 2 wherein the second predetermined time period is a function of the inverse of the frequency of the output frequency signal.

4. A method according to claim 1 wherein the step of determining a rate of change of the phase error over time further comprises the step of:

counting consecutive occurrences of the step of identifying the phase error as desirable.

5. A method according to claim 1 wherein the first predetermined time period is a function of the inverse of the frequency of either the reference frequency signal or the output frequency signal.

6. A method according to claim 1 wherein the step of controlling further comprises the step of:

alternatively selecting between the first and the second loop bandwidth states of the PLL responsive to the indication of the frequency error.

7. A method according to claim 1 wherein the step of controlling further comprises the step of:

varying a loop bandwidth value of the second loop bandwidth state of the PLL responsive to the indication of the frequency error.

8. A method of operating a phase lock loop (PLL) that generates an output frequency signal responsive to a reference frequency signal, wherein the output frequency signal and the reference frequency signal are each characterized by frequency and phase, wherein the PLL is operative in a first loop bandwidth state to maintain the output frequency signal substantially at a frequency indicative of the reference frequency signal, and is operative in a second loop bandwidth state to converge the output frequency signal to the frequency indicative of the reference frequency signal, the method comprising the steps of:

detecting a phase error indicative of the difference between the phase of the reference frequency signal and the phase of the output frequency signal; and     identifying the phase error as either desirable or undesirable;

when the phase error is identified as desirable:

determining a rate of change of the phase error over a first predetermined time period to provide an indication of frequency error between the frequency of the reference frequency signal and the frequency of the output frequency signal; and         controlling a transition between the first and second loop bandwidth states of the PLL responsive to the indication of the frequency error; and     when the phase error is identified as undesirable, operating in the second loop bandwidth state.

9. A method of operating a radio frequency transceiver, comprising the steps of:

generating, with a frequency synthesizer, a synthesized frequency signal responsive to a frequency setting and a reference frequency signal, the synthesized frequency signal and the reference frequency signal are each characterized by frequency and phase, a phase error is indicative of the difference between the phase of the reference frequency signal and the phase of the synthesized frequency signal;

translating a frequency of a modulated signal responsive to the synthesized frequency signal; and     operating a phase lock loop (PLL) within the frequency synthesizer, wherein the PLL is operative in a first loop bandwidth state to maintain the synthesized frequency signal substantially at a first frequency setting, and operative in a second loop bandwidth state to converge the synthesized frequency signal to a second frequency setting, the method controlling the loop bandwidth of the PLL comprising the steps of:

identifying the phase error as either desirable or undesirable;

when the phase error is identified as desirable:

determining a rate of change of the phase error over a first predetermined time period to provide an indication of frequency error between the frequency of the reference frequency signal and the frequency of the synthesized frequency signal; and             controlling a transition between the first and second loop bandwidth states of the PLL responsive to the indication of the frequency error; and         when the phase error is identified as undesirable, operating in the second loop bandwidth state.

10. In a phase lock loop (PLL) that generates an output frequency signal responsive to a reference frequency signal, the output frequency signal and the reference frequency signal are each characterized by frequency and phase, a phase error is indicative of the difference between the phase of the reference frequency signal and the phase of the output frequency signal, the PLL operative in a first loop bandwidth state to maintain the output frequency signal substantially at a frequency indicative of the reference frequency signal, and operative in a second loop bandwidth state to converge the output frequency signal to the frequency indicative of the reference frequency signal, an apparatus for controlling the loop bandwidth of the PLL comprising:

a phase error identifier operative to identify the phase error as either desirable or undesirable;

a rate of change determiner operative to determine, when the phase error is identified as desirable, a rate of change of the phase error over a first predetermined time period to provide an indication of frequency error between the frequency of the reference frequency signal and the frequency of the output frequency signal; and     a loop bandwidth adjuster operative to control, when the phase error is identified as desirable, a transition between the first and second loop bandwidth states of the PLL responsive to the indication of the frequency error, and operative to operate, when the phase error is identified as undesirable, the PLL in the second loop bandwidth state.

11. An apparatus according to claim 10 wherein the phase error identifier further comprises:

an edge proximity detector operative to detecting the proximity, relative to a second predetermined time period, of an indication of the phase of the reference frequency signal to an indication of the phase of the output frequency signal.

12. An apparatus according to claim 11 wherein the second predetermined time period is a function of the inverse of the frequency of the output frequency signal.

13. An apparatus according to claim 10 wherein the rate of change determiner operative to determine a rate of change of the phase error over time further comprises:

a counter operative to count consecutive occurrences of the phase error identified as desirable.

14. An apparatus according to claim 10 wherein the first predetermined time period is a function of the inverse of the frequency of either the reference frequency signal or the output frequency signal.

15. An apparatus according to claim 10 wherein the loop bandwidth adjuster controls the transition by alternatively selecting between the first and the second loop bandwidth states of the PLL responsive to the indication of the frequency error.

16. An apparatus according to claim 10 wherein the loop bandwidth adjuster controls the transition by varying a loop bandwidth value of the second loop bandwidth state of the PLL responsive to the indication of the frequency error.

17. A phase lock loop (PLL) generates an output frequency signal responsive to a reference frequency signal, wherein the output frequency signal and the reference frequency signal are each characterized by frequency and phase, and wherein the PLL is operative in a first loop bandwidth state to maintain the output frequency signal substantially at a frequency indicative of the reference frequency signal, and is operative in a second loop bandwidth state to converge the output frequency signal to the frequency indicative of the reference frequency signal, the PLL comprising:

a phase detector operative to detect a phase error, indicative of the difference between the phase of the reference frequency signal and the phase of the output frequency signal;

a phase error identifier operative to identify the phase error as either desirable or undesirable;

a rate of change determiner operative to determine, when the phase error is identified as desirable, a rate of change of the phase error over a first predetermined time period to provide an indication of frequency error between the frequency of the reference frequency signal and the frequency of the output frequency signal; and a loop bandwidth adjuster operative to control, when the phase error is identified as desirable, a transition between the first and second loop bandwidth states of the PLL responsive to the indication of the frequency error, and operative to operate, when the phase error is identified as undesirable, the PLL in the second loop bandwidth state.

18. A radio frequency transceiver comprising:

a frequency synthesizer operative to generate a synthesized frequency signal responsive to a frequency setting and a reference frequency signal, the synthesized frequency signal and the reference frequency signal are each characterized by frequency and phase, a phase error is indicative of the difference between the phase of the reference frequency signal and the phase of the synthesized frequency signal;

a frequency translator operative to translate a frequency of a modulated signal responsive to the synthesized frequency signal; and a phase lock loop (PLL) within the frequency synthesizer, wherein the PLL is operative in a first loop bandwidth state to maintain the synthesized frequency signal substantially at a first frequency setting, and operative in a second loop bandwidth state to converge the synthesized frequency signal to a second frequency setting, an apparatus for controlling the loop bandwidth of the PLL comprising:

a phase error identifier operative to identify the phase error as either desirable or undesirable;

a rate of change determiner operative to determine, when the phase error is identified as desirable, a rate of change of the phase error over a first predetermined time period to provide an indication of frequency error between the frequency of the reference frequency signal and the frequency of the output frequency signal; and a loop bandwidth adjuster operative to control, when the phase error is identified as desirable, a transition between the first and second loop bandwidth states of the PLL responsive to the indication of the frequency error, and operative to operate, when the phase error is identified as undesirable, the PLL in the second loop bandwidth state.

* * * * *